(12) United States Patent
Lindner et al.

(10) Patent No.: US 12,724,092 B2
(45) Date of Patent: Sep. 1, 2026

(54) MAGNETIC FIELD SENSOR AND METHOD FOR DETECTING A MAGNETIC FIELD

(71) Applicant: Fraunhofer-Gesellschaft zur Förderung der angewandten Forschung e.V., Munich (DE)

(72) Inventors: Lukas Lindner, Freiburg (DE); Jan Jeske, Freiburg (DE); Felix Hahl, Freiburg (DE); Florian Philipp Schall, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 204 days.

(21) Appl. No.: 18/828,762

(22) Filed: Sep. 9, 2024

(65) Prior Publication Data

US 2025/0093431 A1 Mar. 20, 2025

(30) Foreign Application Priority Data

Sep. 14, 2023 (DE) .................... 10 2023 208 946.7

(51) Int. Cl.
*G01R 33/032* (2006.01)
*G01N 21/63* (2006.01)
(Continued)

(52) U.S. Cl.
CPC ....... *G01R 33/032* (2013.01); *G01R 29/0885* (2013.01); *G01R 33/26* (2013.01)

(58) Field of Classification Search
CPC ...... G01R 33/02; G01R 33/032; G01R 33/26; G01R 29/08; G01N 21/63; G01N 21/64
See application file for complete search history.

(56) References Cited

U.S. PATENT DOCUMENTS 9,689,679 B2 6/2017 Budker et al.
2022/0082639 A1 3/2022 Kim et al.
2022/0390529 A1 12/2022 Schröder et al.

FOREIGN PATENT DOCUMENTS

DE 102019203930 A1 * 9/2020 .......... H01S 3/1066
WO 2022183895 A1 9/2022

OTHER PUBLICATIONS

Barry, J., et al., "Sensitivity Optimization for NV-Diamond Magnetometry," https://arxiv.org, arXiv:1903.08176 [quant-ph], arXiv, dated Mar. 2020, pp. 1-63.

(Continued)

*Primary Examiner* — Neel D Shah
(74) *Attorney, Agent, or Firm* — Hussey IP, LLC

(57) ABSTRACT

A magnetic field sensor may be provided comprising at least one diamond which comprises at least one nitrogen-vacancy-center. The magnetic field sensor comprises further at least one optical resonator. The diamond is arranged in the optical resonator. At least one pump laser is provided which is configured to illuminate the diamond with laser radiation having a wavelength of about 480 nm to about 637 nm. The sensor comprises further at least one measuring laser configured to illuminate the diamond with laser radiation having a wavelength from 750 nm to 1040 nm or from 1044 nm to 1500 nm, wherein the sensor comprises at least one detector configured to detect the absorption of the laser radiation of the measuring laser in the diamond. Methods are provided for detecting a magnetic field by the magnetic field sensor.

13 Claims, 4 Drawing Sheets

(51) Int. Cl.

| | |
|---|---|
| ***G01N 21/64*** | (2006.01) |
| ***G01R 29/08*** | (2006.01) |
| ***G01R 33/02*** | (2006.01) |
| ***G01R 33/26*** | (2006.01) |

(56) References Cited

OTHER PUBLICATIONS

Chatzidrosos, G., et al., "Miniature cavity-enhanced diamond magnetometer," https://arxiv.org, arXiv, arXiv:1706.02201 [quant-ph], dated Jun. 7, 2017, pp. 1-6. DOI: https://doi.org/10.1103/PhysRevApplied.8.044019.

Schall, F., et al., "High-contrast absorption magnetometry in the visible to near-infrared range with nitrogen-vacancy ensembles," https://arxiv.org, arXiv:2412.07798 [physics.app-ph], arXiv, dated Dec. 6, 2024, pp. 1-11.

Dumeige, Y, et al., "Magnetometry with nitrogen-vacancy ensembles in diamond based on infrared absorption in a doubly resonant optical cavity," dated 2013, pp. 1-9, The American Physical Society, Physical Review B. 87, 155202 (2013).

Dumeige, Yannick, et al., "Infrared laser threshold magnetometry with a NV doped diamond intracavity etalon," dated Jan. 2019, pp. 1706-1717, Optics Express, Opt. Express, vol. 27, No. 2.

Hahl, Felix, "Cavity-enhanced magnetic-field sensing via stimulated emission from nitrogen-vacancy centres in diamond," dated 2022, pp. 1-162, Universität Freiburg, Freiburg, Germany.

Hahl, Felix, et al., "Magnetic-field-dependent stimulated emission from nitrogen-vacancy centers in diamond," dated Jun. 3, 2022, pp. 1-10, Science Advances, Sci. Adv.8, eabn7192 (2022).

Jensen, K., et al., "Cavity-Enhanced Room-Temperature Magnetometry Using Absorption by Nitrogen-Vacancy Centers in Diamond," pp. 1-5, dated 2014, American Physical Society, Physical Review Letters, 112, 160802 (2014).

Kehayias, P., et al., "Supplementary material to 'The Infrared Absorption Band and Vibronic Structure of the Nitrogen-Vacancy Center in Diamond,'" pp. 1-15, dated Sep. 29, 2013, Physical Review B., available at https://journals.aps.org/prb/supplemental/10.1103/PhysRevB.88.165202.

Rogers, L. J., et al., "Infrared emission of the NV centre in diamond: Zeeman and uniaxial stress studies," dated 2008, pp. 1-16, New Journal of Physics, New J. Phys, vol. 10, 103024.

V. M. Acosta et al., "Broadband magnetometry by infrared-absorption detection of nitrogen-vacancy ensembles in diamond," dated 2010, pp. 1-4, Applied Physics Letters 97, American Institute of Physics, available at pubs.aip.org/aip/apl/article-abstract/97/17/174104/121297/Broadband-magnetometry-by-infrared-absorption?redirectedFrom=fulltext.

V. M. Acosta et al., "Optical properties of the nitrogen-vacancy singlet levels in diamond," dated 2010, pp. 1-4, The American Physical Society, Physical Review B 82, 201202(R) (2010).

* cited by examiner 1
4
S
N
8
22
7
5
31
21
2
3
32

1
4
S
N
8
5
7
31
6
2
3
32

1
4
S
N
8
2
7a
5
35
3
31
21
32
7b

MAGNETIC FIELD SENSOR AND METHOD FOR DETECTING A MAGNETIC FIELD

CROSS-REFERENCE TO RELATED APPLICATIONS

This application claims priority under 35 USC § 119 to German Patent Application No. 10 2023 208 946.7, filed Sep. 14, 2023, which is hereby incorporated herein by reference.

BACKGROUND

The invention relates in one aspect to a magnetic field sensor comprising at least one diamond which comprises at least one nitrogen-vacancy-center. The magnetic field sensor comprises further at least one optical resonator. The diamond is arranged in said optical resonator. At least one pump laser is provided which is configured to illuminate the diamond with laser radiation having a wavelength of about 480 nm to about 637 nm. The invention relates in another aspect to a method for detecting a magnetic field with at least one diamond comprising at least one nitrogen-vacancy-center. Said diamond is arranged in an optical resonator and illuminated with laser radiation having a wavelength of about 480 nm to about 637 nm.

F. A. Hahl et al.: "Magnetic-field-dependent stimulated emission from nitrogen-vacancy centers in diamond". Sci. Adv. 8, eabn7192 (2022) discloses the use of at least one diamond comprising at least one Nitrogen-vacancy-center in order to determine a magnetic field. In this known sensor, the diamond is arranged in an optical resonator and irradiated with green light from a pump laser. The diamond shows magnetic field-dependent photoluminescence, thereby causing stimulated emission with the diamond acting as active laser material. Since the emission decreases with increasing magnetic field, the strength of the magnetic field can be determined when measuring the intensity of the emitted laser light. The maximum contrast of this known sensor is 33% or less.

BRIEF DESCRIPTION OF THE DRAWINGS

The accompanying figures, where like reference numerals refer to identical or functionally similar elements throughout the separate views, which are not true to scale, and which, together with the detailed description below, are incorporated in and form part of the specification, serve to illustrate further various embodiments and to explain various principles and advantages all in accordance with the devices, apparatuses, and methods. Advantages of embodiments of the systems, apparatuses, and methods will be apparent from the following detailed description of the exemplary embodiments thereof, which description should be considered in conjunction with the accompanying drawings in which.

DETAILED DESCRIPTION

Figure 1:
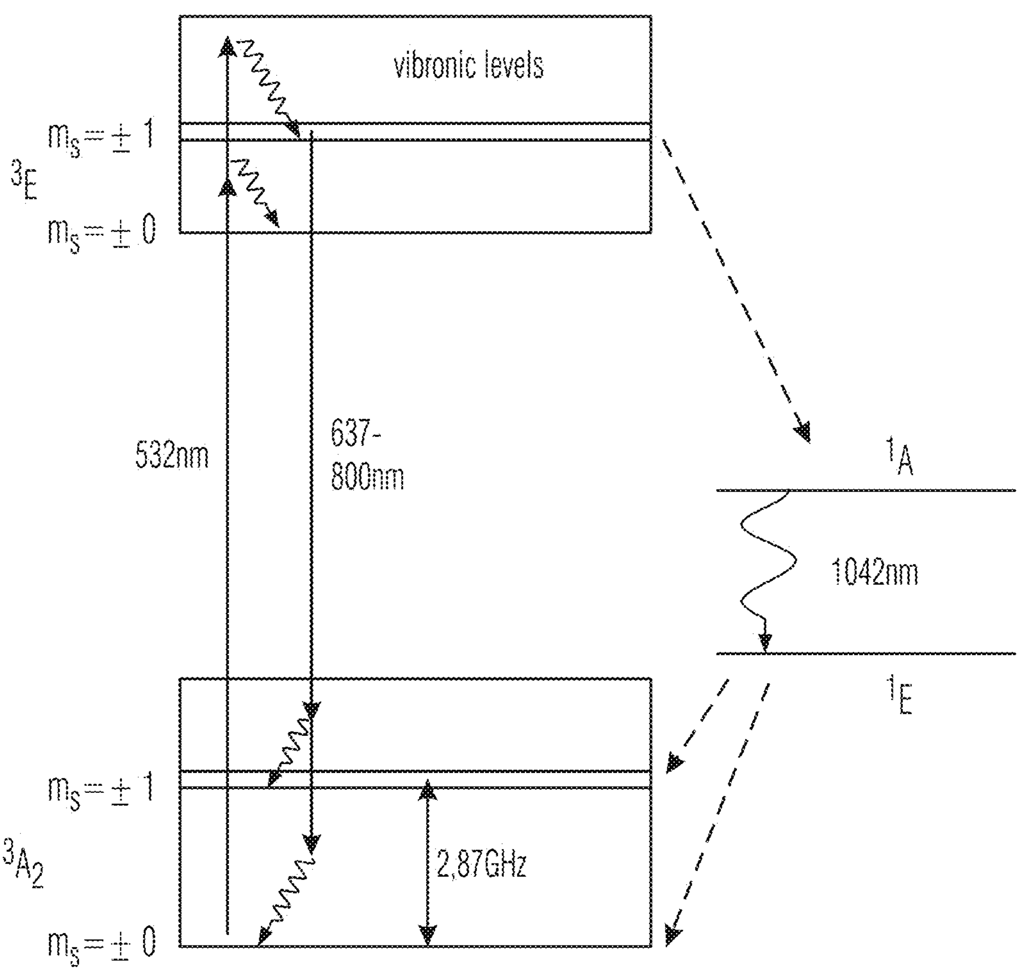
FIG. 1 illustrates the term scheme of a Nitrogen-vacancy-center in diamond.

As required, detailed embodiments of the devices, products, apparatuses, and methods are disclosed herein; however, it is to be understood that the disclosed embodiments are merely exemplary of the devices, products, apparatuses, and methods which can be embodied in various forms. Therefore, specific structural and functional details disclosed herein are not to be interpreted as limiting, but merely as a basis for the claims and as a representative basis for teaching one skilled in the art to variously employ the devices, products, apparatuses, and methods in virtually any appropriately detailed structure. Further, the terms and phrases used herein are not intended to be limiting; but rather, to provide an understandable description of the devices, products, apparatuses, and methods. While the specification concludes with claims defining the features of the devices, products, apparatuses, and methods that are regarded as novel, it is believed that the devices, products, apparatuses, and methods will be better understood from a consideration of the following description in conjunction with the drawing figures, in which like reference numerals are carried forward.

In the following detailed description, reference is made to the accompanying drawings which form a part hereof, and in which are shown by way of illustration embodiments that may be practiced. It is to be understood that other embodiments may be utilized, and structural or logical changes may be made without departing from the scope. Therefore, the following detailed description is not to be taken in a limiting sense, and the scope of embodiments is defined by the appended claims and their equivalents.

Alternate embodiments may be devised without departing from the spirit or the scope of the invention. Additionally, well-known elements of exemplary embodiments of the devices, products, apparatuses, and methods will not be described in detail or will be omitted so as not to obscure the relevant details of the systems, apparatuses, and methods.

Before the devices, products, apparatuses, and methods are disclosed and described, it is to be understood that the terminology used herein is for the purpose of describing particular embodiments only and is not intended to be limiting. The terms "comprises," "comprising," or any other variation thereof are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a" does not, without more constraints, preclude the existence of additional identical elements in the process, method, article, or apparatus that comprises the element. The terms "including" and/or "having," as used herein, are defined as comprising (i.e., open language). The terms "a" or "an", as used herein, are defined as one or more than one. The term "plurality," as used herein, is defined as two or more than two. The term "another," as used herein, is defined as at least a second or more. The description may use the terms "embodiment" or "embodiments," which may each refer to one or more of the same or different embodiments.

For the purposes of the description, a phrase in the form "A/B" or in the form "A and/or B" or in the form "at least one of A and B" means (A), (B), or (A and B), where A and B are variables indicating a particular object or attribute. When used, this phrase is intended to and is hereby defined as a choice of A or B or both A and B, which is similar to the phrase "and/or". Where more than two variables are present in such a phrase, this phrase is hereby defined as including only one of the variables, any one of the variables, any combination of any of the variables, and all of the variables, for example, a phrase in the form "at least one of A, B, and C" means (A), (B), (C), (A and B), (A and C), (B and C), or (A, B and C).

Relational terms such as first and second, top and bottom, and the like may be used solely to distinguish one entity or action from another entity or action without necessarily requiring or implying any actual such relationship or order between such entities or actions. The description may use perspective-based descriptions such as up/down, back/front, top/bottom, and proximal/distal. Such descriptions are merely used to facilitate the discussion and are not intended to restrict the application of disclosed embodiments. Various operations may be described as multiple discrete operations in turn, in a manner that may be helpful in understanding embodiments; however, the order of description should not be construed to imply that these operations are order dependent.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. As used herein, the terms "substantial" and "substantially" means, when comparing various parts to one another, that the parts being compared are equal to or are so close enough in dimension that one skill in the art would consider the same. Substantial and substantially, as used herein, are not limited to a single dimension and specifically include a range of values for those parts being compared. The range of values, both above and below (e.g., "+/−" or greater/lesser or larger/smaller), includes a variance that one skilled in the art would know to be a reasonable tolerance for the parts mentioned.

Herein various embodiments of the systems, apparatuses, and methods are described. In many of the different embodiments, features are similar. Therefore, to avoid redundancy, repetitive description of these similar features may not be made in some circumstances. It shall be understood, however, that description of a first-appearing feature applies to the later described similar feature and each respective description, therefore, is to be incorporated therein without such repetition.

According to one aspect of the invention, a magnetic field sensor is disclosed. The magnetic field sensor comprises at least one diamond that comprises at least one Nitrogen-vacancy-center (NV center). The Nitrogen-vacancy-center can be a negatively charged $NV^-$ center. In some embodiments of the invention, a plurality of Nitrogen-vacancy-centers may be present in the diamond. The diamond may be polycrystalline or monocrystalline. The diamond may be an artificially produced HPHT (high pressure/high temperature) diamond or a CVD diamond obtained in a low pressure synthesis by chemical vapour deposition. In some embodiments of the invention, the diamond is nominally undoped and comprises as few impurities or imperfections as possible.

In some embodiments of the invention, the diamond is arranged in at least one optical resonator. The optical resonator is formed by at least two opposite mirrors which enclose a volume between them. At least one of the mirrors may be partially transparent so that light may be coupled into or out of the resonator through the mirror. The mirrors may be plane mirrors or may have a concave shape. Multiple reflections of light within the resonator may cause standing waves to form in the resonator, the wavelength of which is given by the eigenmodes or resonant frequency of the resonator. For the purposes of the present invention, the diamond is located within the optical resonator if it is at least partially located in the beam path of the light travelling inside of the resonator.

The device may further comprise at least one pump laser which is designed to illuminate the diamond with laser radiation having a wavelength of about 480 nm to about 637 nm. For this purpose, the light of the pump laser may be coupled through at least one mirror of the resonator into the resonator and the diamond disposed therein. In this embodiment, the beam path of the pump laser may lie approximately on the longitudinal axis of the resonator, i.e. the longitudinal axis of the resonator and the pump laser may enclose an angle of about −5° to about +5°. In other embodiments of the invention, the angle between the laser beam of the pump laser and the longitudinal extension of the resonator may also be greater and may, for example, be between about 20° and about 90°. In this case, the light from the pump laser may be coupled directly into the diamond past the resonator mirror.

Furthermore, the magnetic field sensor may comprise at least one measuring laser. The measuring laser is designed to couple laser radiation into the diamond. In addition, the magnetic field sensor may comprise a detector that is designed to detect the absorption of the laser radiation from the measuring laser in the diamond. The detector thus detects the light from the measuring laser after it has passed through at least one partial volume of the diamond at least once. For this purpose, the measuring laser, on the one hand, and the detector, on the other hand, may be arranged at different ends of the resonator so that the light is coupled into and out of the diamond through partially transparent mirrors of the resonator. In other embodiments of the invention, the beam path may also take a different form. In particular, the light may be coupled into and/or out of the diamond laterally. In some embodiments of the invention, the light from the measuring laser may pass through the resonator and thus through the diamond arranged in the beam path multiple times before it falls on the detector. As a result, the absorption of at least one resonator mode in the diamond is determined.

In some embodiments of the invention, the measuring laser is designed to generate laser radiation having a wavelength of about 750 nm to about 1040 nm. In other embodiments of the invention, the measuring laser is designed to generate laser radiation having a wavelength of about 1044 nm to about 1500 nm. In yet other embodiments of the invention, the measuring laser may generate light having a wavelength of about 750 nm to about 1040 nm and of about 1044 nm to about 1300 nm. Therefore, in contrast to known magnetic field sensors, the measuring laser does not excite the singlet states $^1A$ and $^1E$. The wavelength is deliberately chosen so that it does not correspond to the resonance of the singlet states.

In some embodiments of the invention, the optical resonator may have a finesse of more than 200. This minimizes optical losses when carrying out the measurement so that the sensitivity may be increased. The specified finesse is understood for an optical resonator in which the diamond is arranged during the measurement of the finesse. In general, the presence of the diamond will degrade the properties of the resonator and reduce the finesse due to absorption. The influence of the diamond on the finesse is therefore included in the specified values.

In contrast to known sensors, the magnetic field sensor according to embodiments disclosed may therefore not based on the detection of photoluminescence or emitted red light but on the absorption of infrared radiation that changes with the external magnetic field. This may significantly increase the sensitivity, although the employed infrared wavelength range of the measuring laser cannot resonantly populate or depopulate a known energy level of the Nitrogen-vacancy-center. In order to carry out a measurement, it is only necessary to apply pump light to the diamond. In some embodiments of the invention, this may be done in the continuous wave operation of the pump light source. Then, the absorption of the infrared radiation from the measuring laser may be detected by means of the at least one detector. After calibration, the absorption may be set in relation to the acting magnetic field. The employed measurement setup is simple and surprisingly has a higher sensitivity than known sensors that evaluate luminescent radiation which is emitted by the diamond.

In some embodiments of the invention, the optical resonator may have a finesse of more than 300. In other embodiments of the invention, the optical resonator may have a finesse of more than 500. In yet other embodiments of the invention, the optical resonator may have a finesse of more than 1000. The specified finesse is understood for an optical resonator in which the diamond is arranged during the measurement of the finesse. In general, the presence of the diamond will degrade the properties of the resonator and reduce the finesse due to absorption. The influence of the diamond on the finesse is therefore included in the specified values.

In some embodiments of the invention, the optical resonator may have a finesse of less than 8000. In other embodiments of the invention, the optical resonator may have a finesse of less than 4000. In yet other embodiments of the invention, the optical resonator may have a finesse of less than 3000. As a result, the optical resonator may have total losses of about 3.1% to about 0.02%. An optical resonator of this type may further increase the sensitivity of the magnetic field measurement.

In some embodiments of the invention, the measuring laser may be designed to generate laser radiation having a wavelength of about 750 nm to about 1300 nm. In other embodiments of the invention, the measuring laser may be designed to generate laser radiation having a wavelength of about 800 nm to about 1500 nm. In yet other embodiments of the invention, the measuring laser may be designed to generate laser radiation having a wavelength of about 800 nm to about 1300 nm. In each case, a wavelength range of about 1012 nm to about 1072 nm or of about 1022 nm to about 1062 nm or of about 1035 nm to about 1049 nm or of about 1041 nm to about 1043 nm is excluded. As a result, the measuring laser does not excite the singlet states $^1$A and $^1$E.

In some embodiments of the invention, the measuring laser is designed not to generate light having a wavelength of about 982 nm to about 942 nm. In other embodiments of the invention, the measuring laser is designed not to generate light having a wavelength of about 992 nm to about 932 nm. In still other embodiments of the invention, the measuring laser is designed not to generate light having a wavelength of about 905 nm to about 919 nm.

In some embodiments of the invention, the measuring laser may be designed to generate laser radiation having a wavelength of about 750 nm to about 1000 nm. In other embodiments of the invention, the measuring laser may be designed to generate laser radiation having a wavelength of about 800 nm to about 1000 nm.

In some embodiments of the invention, the optical resonator may be manufactured by coating the diamond with at least one mirror layer. This results in a particularly simple mechanically robust structure.

In some embodiments of the invention, the optical resonator may have an adjustable resonant frequency. In some embodiments of the invention, this may be achieved by moving a mirror along the longitudinal axis of the resonator, for example by means of a micrometer screw or a piezo actuator. This allows the resonator modes to be adapted to the wavelength of the measuring laser, thereby further increasing the measuring accuracy and/or sensitivity.

In some embodiments of the invention, the diamond may have a background absorption of about 0.1 $cm^{-1}$ or better. Due to the low absorption of electromagnetic radiation in the diamond, the finesse of the optical resonator provided with the diamond may be increased.

In some embodiments of the invention, the absorption of electromagnetic radiation in the diamond in the wavelength range of about 680 nm to about 760 nm may be less than about 0.2 $cm^{-1}$ or less than about 0.1 $cm^{-1}$ or less than about 0.05 $cm^{-1}$ or less than about 0.01 $cm^{-1}$. The absorption coefficient may be measured by UV-VIS spectroscopy. The measurement may be carried out by means of an Ulbricht sphere to detect the transmitted light. The reflection at the surface of the substrate due to the difference in the refractive indices is taken into account here.

In some embodiments of the invention, the absorption of electromagnetic radiation in the diamond in the wavelength range of about 680 nm to about 760 nm may be greater than about 0.001 $cm^{-1}$.

In some embodiments of the invention, the diamond may have a concentration of $NV^-$ centers of 0.5 ppm or higher. This further increases the signal-to-noise ratio of the measurement, from which a higher accuracy and/or higher sensitivity in the measurement of magnetic fields may be obtained.

In some embodiments of the invention, the employed diamond may comprise $NV^-$ centers at a concentration of less than about 10.0 ppm, or less than about 3.0 ppm, or less than about 2.5 ppm, or less than about 2.0 ppm. However, the concentration of the $NV^-$ centers may be greater than about 1 ppm or greater than about 1.5 ppm.

In some embodiments of the invention, the diamond may have a volume of about 100 μm×100 μm×300 μm or greater. As a result, the volume available for the measurement may be increased so that the sensitivity may be increased.

In some embodiments of the invention, the magnetic field sensor may further have at least one radio frequency transmitter, by means of which microwave radiation may be generated at least at the location of the diamond. In some embodiments of the invention, the microwave radiation may have a frequency of about 2.77 GHz to about 2.97 GHz. In some embodiments of the invention, the frequency of the microwave radiation may be changed during the measurement. The effect of this feature is that, within the ground state $^3$A, electrons are excited from the ground state with spin quantum number 0 to the excited state with spin quantum number ±1. Since the degeneracy of the spin states +1 and −1 is canceled in the presence of a magnetic field, the level of a magnetic field may be determined from the energetic splitting of the two energy levels.

When determining a magnetic field by means of the magnetic field sensor according to the invention, the sensitivity may be between about 8 $pT/\sqrt{Hz}$ and about 40 $pT/\sqrt{Hz}$. Therefore, a more accurate determination of the magnetic field is possible compared to known methods.

In some embodiments of the invention, the method for detecting a magnetic field may be carried out at room temperature. In some embodiments of the invention, the method for detecting a magnetic field may be carried out at a temperature of more than 260 K or more than 280 K. This saves the expense associated with the generation of cryogenic temperatures.

The invention will be explained in more detail below with reference to drawings and exemplary embodiments without limiting the general concept of the invention. In this connection, FIG. 1 shows the term scheme of an Nitrogen-vacancy-center in diamond. The term scheme of the Nitrogen-vacancy-center may be influenced by a magnetic field. The magnetic field may be inferred by measuring this influence.

The Nitrogen-vacancy-center consists of a nitrogen atom that is installed on a lattice site of the diamond instead of a carbon atom and a neighboring vacancy in the crystal lattice. It is known from electron spin resonance measurements that the Nitrogen-vacancy-center has an even number of electrons with a total spin of 1. Both the ground state $^3A$ and the excited state $^3E$ thus form a triplet state. The electron spin of this state may assume the values −1, 0 and +1. In the absence of an external magnetic field, the energy levels of the +1 state and the −1 state are degenerate. The presence of a magnetic field leads to the splitting of these levels since the total spin may be aligned parallel or antiparallel to the field vector. As may also be seen from FIG. 1, the energy levels of the states with spin ±1 are above the energy level of the state with spin 0 without an external magnetic field applied.

By supplying pump light from a pump light source 4, electrons may be raised from the ground state $^3A$ to the excited state $^3E$. The pump light used for this purpose may be selected from the green spectral range and have a wavelength of about 532 nm to about 550 nm or of about 480 nm to about 637 nm, for example.

The excited state $^3E$ decays radiantly, emitting red light having a wavelength of about 637 nm to about 800 nm. Alternatively, the excited state with the spin quantum number +1 decays via the singlet states $^1A$ and $^1E$ into the ground state $^3A$.

Within the ground state $^3A$, electrons may be excited from the ground state with spin quantum number 0 into the excited state with spin quantum number ±1. High-frequency radiation from a radio frequency transmitter 6, which has a frequency of about 2.88 GHz, may be used for this purpose. This frequency changes in the presence of an external magnetic field when the degeneracy of the spin states +1 and −1 is canceled. It is therefore possible to determine a magnetic field according to the prior art by continuously supplying pump light to the active medium and determining fluorescent light while changing the frequency of the electromagnetic radiation. The contrast achievable in this way is 22% or less.

According to one aspect of the invention, it has been recognized that infrared light having a wavelength of about 750 nm to about 1040 nm and/or of about 1044 nm to about 1500 nm is absorbed by the diamond when electrons have been raised from the ground state $^3A$ to the excited state $^3E$ by supplying pump light from a pump light source 4. This absorption is also dependent on the spin state of the Nitrogen-vacancy-center, i.e. the absorption may be influenced by a magnetic field prevailing at the location of the Nitrogen-vacancy-center. Therefore, the spin-dependent induced absorption may be used for magnetic field measurement, it being possible to achieve a contrast of 50% or more. The spin-dependent induced absorption thus has the potential to improve the sensitivity of a magnetic field sensor.

Figure 2:
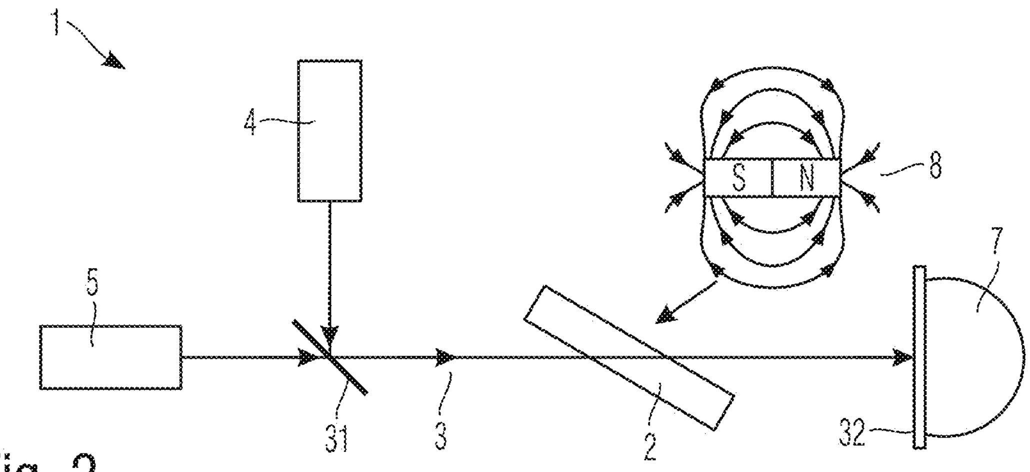
FIG. 2 illustrates a magnetic field sensor according to a first embodiment.

FIG. 2 shows a magnetic field sensor 1 according to a first embodiment of the invention. The magnetic field sensor 1 comprises a diamond 2. The diamond 2 may be polycrystalline or monocrystalline. The diamond 2 is preferably, but not necessarily, nominally undoped. The diamond 2 may have the form of a cuboid and have, for example, a volume of about 100×100 μm×300 μm or more. In some embodiments of the invention, the diamond has a high crystal quality, resulting in a background absorption of about 0.1 $cm^{-1}$ or better at least in the green and infrared spectral range up to about 1500 nm.

Furthermore, the diamond comprises Nitrogen-vacancy-centers, which are formed in a manner known per se by a nitrogen atom that is incorporated on a lattice site instead of a carbon atom. A lattice site adjacent to the nitrogen atom has a vacancy. The Nitrogen-vacancy-centers used for the magnetic field measurement are negatively charged, the diamond having an $NV^-$ concentration of 0.5 ppm or more in some embodiments of the invention.

The diamond is located in an optical resonator 3 which is formed by a first mirror 31 and a second mirror 32. The mirrors may be planar or concave in shape. The mirrors may be partially transparent so that part of the incoming radiation is reflected and another part is transmitted. In the illustrated exemplary embodiment, the first mirror 31 is arranged in inclined fashion in order to simultaneously perform a function as a beam splitter in this way in order to combine the laser beams of the below described pump lasers 4 and measuring lasers 5. In some embodiments of the invention, the optical resonator 3 has a high resonator quality or finesse, which may, for example, be more than 200, more than 300, more than 500 or more than 1000.

During the operation of the magnetic field sensor 1, pump light from a pump laser 4 is supplied to the diamond 2. The pump laser 4 is designed to generate laser radiation having a wavelength of about 480 nm to about 637 nm. In the illustrated exemplary embodiment, the pump light from the pump laser 4 is reflected at the first mirror 31 and, along the longitudinal axis of the optical resonator 3, is coupled into it.

Furthermore, the magnetic field sensor 1 comprises a measuring laser 5, which generates laser radiation that is coupled into the optical resonator 3 in a straight line through the partially transparent first mirror 31. The measuring laser generates laser radiation which has a wavelength of about 750 nm to about 1040 nm and/or of about 1044 nm to about 1500 nm. The laser radiation from the measuring laser 5 passes through the diamond 2 once or also multiple times and then strikes a detector 7, which is arranged behind the second mirror 32 that is also partially transparent. The detector 7 may detect the attenuation of the laser radiation from the measuring laser 7.

If the diamond 2 is exposed to a magnetic field that is generated by means of the magnetic field generating apparatus 8, the absorption of the laser radiation from the measuring laser 5 is the greater, the greater the magnetic field is. Accordingly, the absorption of the laser radiation from the measuring laser 5 becomes weaker when the magnetic field decreases. The magnetic field may therefore be determined by detecting the intensity of the laser radiation from the measuring laser 5 by means of the detector 7.

FIGS. 3 to 6 illustrate further embodiments of the invention in more detail. Identical components of the invention are provided with identical reference signs so that the following description is limited to the substantial differences.

Figures 3, 4, 5:
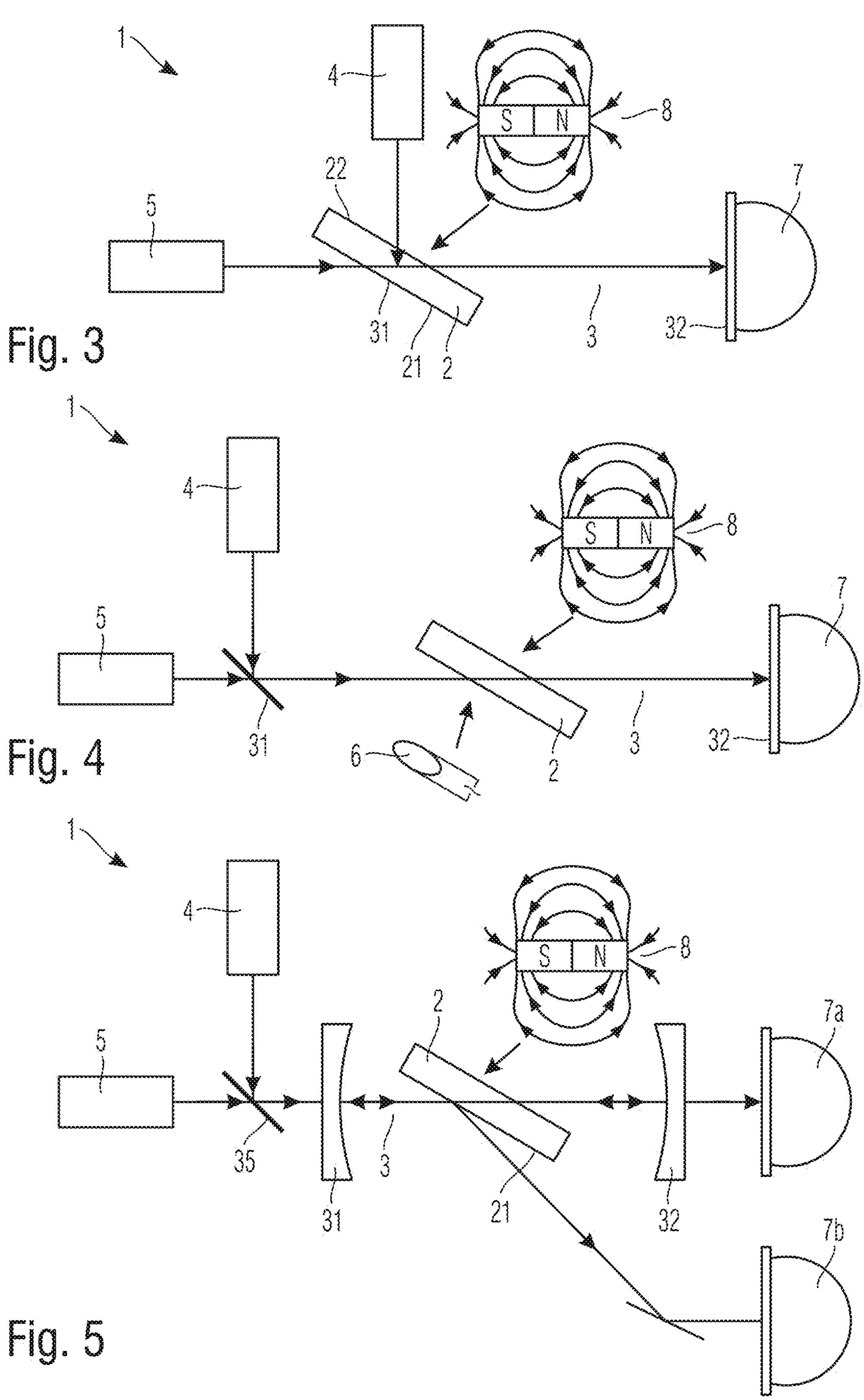
FIG. 3 illustrates a magnetic field sensor according to a second embodiment.
FIG. 4 illustrates a magnetic field sensor according to a third embodiment.
FIG. 5 illustrates a magnetic field sensor according to a fourth embodiment.

FIG. 3 shows a second embodiment of the invention. The resonator 3 according to the second embodiment comprises a second mirror 32, which is designed as a planar, partially transparent mirror, as in the first above described embodiment. The first mirror 31, on the other hand, is designed as a coating on the first side 21 of the diamond 2. The laser radiation from the measuring laser 5 is here coupled into the diamond 2 from the first side 21, this radiation penetrating the coating forming the first mirror 31. The pump light of the pump laser 4 is coupled into the diamond 2 from the opposite second side and reflected at the coating forming the first mirror 31 on the first side 21 of the diamond 2. In this way, the resonator 3 may be constructed with fewer components so that losses at additional interfaces are prevented and the finesse is further increased.

In some embodiments, the angle of the diamond 2 to the longitudinal axis of the resonator may be selected in such a way that the pump light of the pump laser 4 is totally reflected at the interface formed on the first side 21 of the diamond 2. In this case, a coating may be omitted so that the first mirror 31 is formed directly by the diamond 2.

A third embodiment of the invention is explained in more detail with reference to FIG. 4. The third embodiment differs from the above described first embodiment in that an radio frequency transmitter is also present, by means of which microwave radiation may be generated at the location of the diamond 2. The microwave radiation may have a frequency of about 2.77 GHz to about 2.97 GHz. The microwave radiation is used to excite, within the ground state $^3A$, electrons from the ground state with the spin quantum number 0 to the excited state with the spin quantum number ±1. Since the degeneracy of the spin states +1 and −1 is canceled when a magnetic field is present, it is thus possible to further increase the sensitivity of the measurement method.

FIG. 5 illustrates a fourth embodiment of the magnetic field sensor 1 in more detail. The fourth embodiment differs from the first embodiment in that it has a resonator 3 which is bounded by a first mirror 31 and a second mirror 32, the first and second mirrors 31 and 32 each having a concave shape. Reflected light is thus focused by the first and second mirrors onto a focal point in the center of the optical resonator 3. This may further improve the resonator quality or finesse so that the optical resonator has total losses of about 0.02% to about 3.1%. The diamond 2 may be arranged at the focal point of the mirrors.

While in the above-described embodiments, the first mirror 31 simultaneously acts as a beam splitter to combine the light from the pump laser 4 and the measuring laser 5 in a single beam path, the fourth embodiment described with reference to FIG. 5 uses a separate beam splitter 35 in the form of a partially transparent mirror or prism inclined to the beam path.

Finally, FIG. 5 shows a first detector 7*a* and a second detector 7*b*. The first detector 7*a* detects a resonator mode which is coupled out through the partially transparent second mirror 32. In contrast, the second detector 7*b* detects light that is reflected at the first side 21 of the diamond 2. Both detectors thus detect light that has passed through the diamond 2 and, in so doing, has been partially absorbed so that the measurement signal from both detectors may be used as a measure of the acting magnetic field. The use of two detectors has the advantage that the measured values from both detectors may be checked for plausibility in order to increase the accuracy of the magnetic field measurement in this way. It should be noted that in some embodiments the detector 7*a* may also be omitted so that the second detector 7*b* as the sole detector detects the absorption of the light from the measuring laser 5 in the diamond 2.

Figure 6:
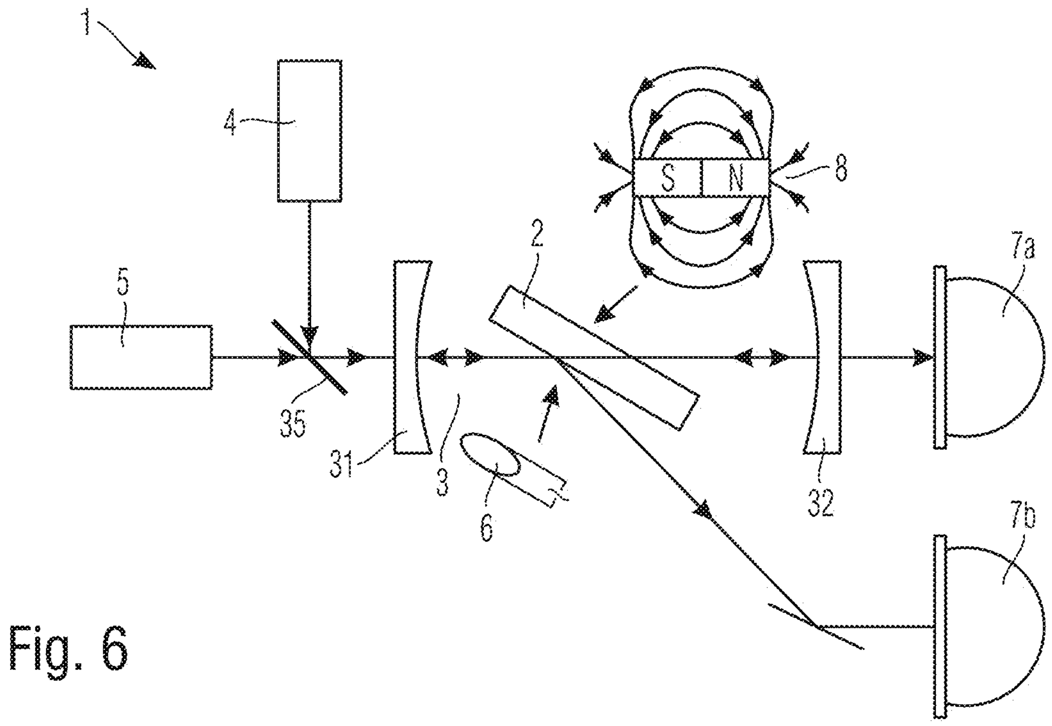
FIG. 6 illustrates a magnetic field sensor according to a fifth embodiment.

FIG. 6 is used to explain a fifth embodiment in more detail. The fifth embodiment substantially corresponds to the fourth embodiment, which was explained in more detail with reference to FIG. 5, the radio frequency transmitter 6 already explained in the third embodiment being available in order to further increase the sensitivity and/or the measurement accuracy.

Figure 7:
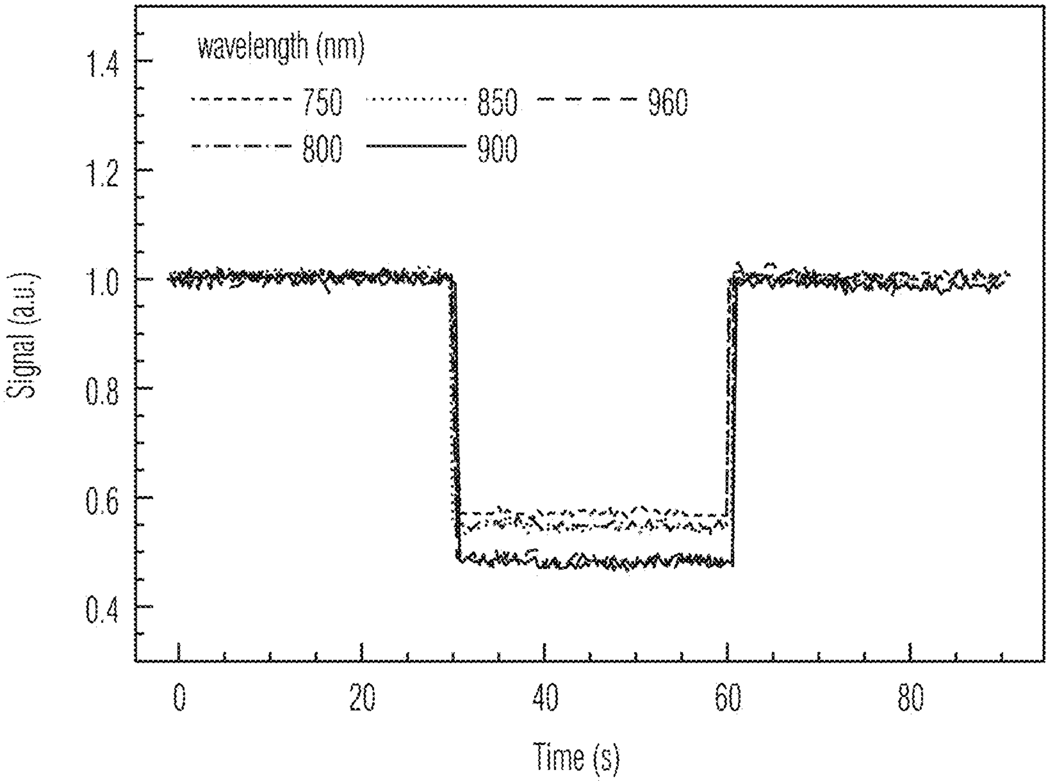
FIG. 7 illustrates the result of a magnetic field measurement with a magnetic field sensor as disclosed.

FIG. 7 shows a measurement signal recorded with the above-described magnetic field sensor. The signal intensity in the detector 7 is shown on the ordinate and the time on the abscissa. In this case, no magnetic field is applied for the first 30 seconds, then the diamond 2 is exposed to a magnetic field for 30 seconds. After 60 seconds, the magnetic field is switched off again.

The intensity of the infrared radiation emitted by the measuring laser 5 is shown for different wavelengths, namely for 750 nm, for 800 nm, for 850 nm, for 900 nm and for 960 nm. As shown in FIG. 7, the presence of a magnetic field causes the signal to be attenuated by at least 40% due to absorption in the diamond. At some wavelengths there is even an attenuation of 50%. The contrast of the measurement determined in this way is at least a factor of 2 higher than with known magnetic field sensors, in which the fluorescent light emitted from the diamond is detected.

Figure 8:
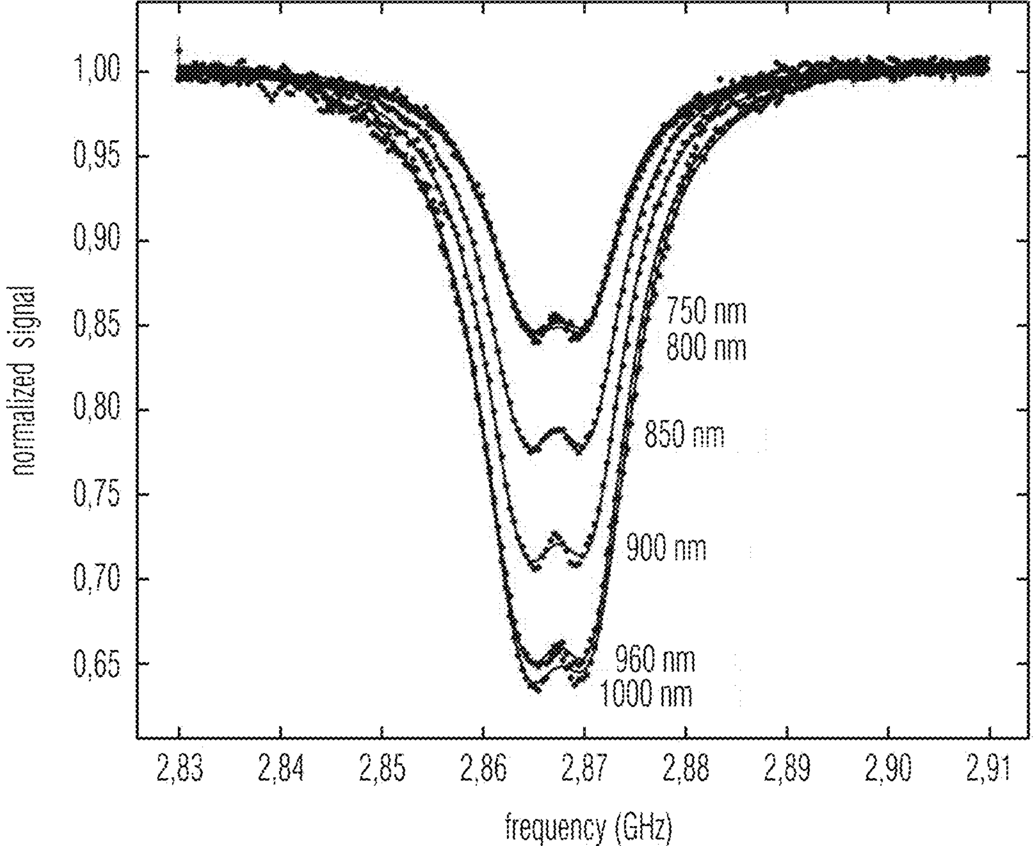
FIG. 8 illustrates a measurement of optically detected magnetic resonance at different wavelengths.

FIG. 8 shows the optically detected magnetic resonance at different wavelengths. Again, the intensity of the light emitted by the measuring laser 5 after it has been at least partially absorbed in the diamond 2 is shown on the ordinate and the frequency of an radio frequency transmitter 6 on the abscissa. It may again be seen that the absorption is particularly high for wavelengths above the fluorescent light.

The foregoing description and accompanying drawings illustrate the principles, exemplary embodiments, and modes of operation of the systems, apparatuses, and methods. However, the systems, apparatuses, and methods should not be construed as being limited to the particular embodiments discussed above. Additional variations of the embodiments discussed above will be appreciated by those skilled in the art and the above-described embodiments should be regarded as illustrative rather than restrictive. Accordingly, it should be appreciated that variations to those embodiments may be made by those skilled in the art without departing from the scope of the systems, apparatuses, and methods as defined by the following claims.

The invention claimed is:

1. A magnetic field sensor comprising:

at least one optical resonator having a finesse of more than 200;

at least one diamond comprising at least one nitrogen-vacancy-center, wherein said diamond is arranged in said optical resonator;

at least one pump laser configured to illuminate the diamond with laser radiation having a wavelength of about 480 nm to about 637 nm;

at least one measuring laser configured to couple laser radiation into the diamond, wherein said laser radiation of the measuring laser has a wavelength of 750 nm to 1040 nm and/or of 1044 nm to 1500 nm; and at least one detector configured to detect the absorption of the laser radiation of the measuring laser in the diamond.

2. The magnetic field sensor of claim 1, wherein the optical resonator has a finesse of more than 300 or more than 500 or more than 1000 and/or wherein the optical resonator has a finesse of less than 8000 or less than 4000 or less than 3000 and/or wherein the optical resonator has total losses of about 3.09% to about 0.02%.

3. The magnetic field sensor of claim 1, wherein said laser radiation of the measuring laser has a wavelength of about 750 nm to about 1300 nm or of about 800 nm to about 1500 nm or of about 800 nm to about 1300 nm, wherein a wavelength ranging from about 1012 nm to about 1072 nm or from about 1022 nm to about 1062 nm or from about 1035 nm to about 1049 nm or from about 1041 nm to about 1043 nm is excluded.

4. The magnetic field sensor of claim 1, wherein said laser radiation of the measuring laser has a wavelength of about 750 nm to about 1000 nm or of about 800 nm to about 1000 nm.

5. The magnetic field sensor of claim 1, wherein the optical resonator is obtainable by coating the diamond with at least one mirror layer.

6. The magnetic field sensor of claim 1, wherein the optical resonator is configured to have an adjustable resonant frequency.

7. The magnetic field sensor of claim 1, wherein the diamond has an absorption of about 0.1 $cm^{-1}$ or less and the diamond has an $NV^-$ concentration of 0.5 ppm or higher and wherein the diamond has a volume of about 100 μm×100 μm×300 μm or more.

8. The magnetic field sensor of claim 1, further comprising a radio frequency transmitter configured to generate microwave radiation at least at the location of the diamond.

9. A method for detecting a magnetic field by means of a magnetic field sensor, said magnetic field sensor comprising at least one optical resonator having a finesse of more than 200;

at least one diamond comprising at least one nitrogen-vacancy-center, wherein said diamond is arranged in said optical resonator;

at least one detector;

at least one pump laser; and at least one measuring laser, wherein said method for detecting the magnetic field comprises:

illuminating the diamond with laser radiation having a wavelength of about 480 nm to about 637 nm from said pump laser, illuminating the diamond with laser radiation having a wavelength of 750 nm to 1040 nm and/or of 1044 nm to 1500 nm from said measuring laser, and measuring the absorption of the laser radiation of the measuring laser in the diamond with said detector.

10. The method of claim 9, wherein the laser radiation from said measuring laser has a wavelength from about 750 nm to about 1000 nm or from about 800 nm to about 1000 nm.

11. The method of claim 9, wherein the diamond is exposed to microwave radiation at a frequency of about 2.77 GHz to about 2.97 GHz while illuminating the diamond with laser radiation from said pump laser.

12. The method of claim 9, wherein a magnetic field is detected with a sensitivity of about 8 pT/sqrt (Hz) to about 40 pT/sqrt (Hz).

13. The method of claim 9, wherein the resonant frequency of the optical resonator is changed cyclically.

* * * * *